United States Patent [19]
Wright

[11] Patent Number: 5,373,419
[45] Date of Patent: Dec. 13, 1994

[54] LEVER MECHANISM

[75] Inventor: Andrew C. W. Wright, Farnham, Great Britain

[73] Assignee: Dzus Fastener Europe Limited, Farnham, Great Britain

[21] Appl. No.: 119,994

[22] Filed: Sep. 10, 1993

[30] Foreign Application Priority Data

Sep. 11, 1992 [GB] United Kingdom ............... 9219322

[51] Int. Cl.$^5$ .............................................. H05K 5/00
[52] U.S. Cl. ....................................... 361/755; 361/754; 439/152; 439/157
[58] Field of Search ................. 211/41; 361/607, 609, 361/726, 732, 740, 747, 754, 755, 759, 798, 801; 403/16, 321, 322, 325, 330; 439/152, 153, 155, 157, 325, 327, 328, 331, 345, 629

[56] References Cited

U.S. PATENT DOCUMENTS

| | | | |
|---|---|---|---|
| 4,157,583 | 6/1979 | Basmajian et al. | 361/801 |
| 4,699,594 | 10/1987 | Assel et al. | 439/152 |
| 4,975,073 | 12/1990 | Weisman | 439/157 |
| 5,006,951 | 4/1991 | Albert et al. | 439/157 |
| 5,293,303 | 3/1994 | Fletcher et al. | 439/152 |

FOREIGN PATENT DOCUMENTS

| | | | |
|---|---|---|---|
| 7724549 | 1/1978 | Germany. | |
| 3732892A1 | 4/1989 | Germany. | |
| 1-76798 | 3/1989 | Japan | 361/798 |
| 1-268098 | 10/1989 | Japan | 361/798 |
| 4-188794 | 7/1992 | Japan | 361/798 |
| 2231726A | 11/1990 | United Kingdom. | |

Primary Examiner—Leo P. Picard
Assistant Examiner—Donald A. Sparks
Attorney, Agent, or Firm—Hoffmann & Baron

[57] ABSTRACT

Disclosed is a lever mechanism for clamping a board to a housing. A support block is provided and is adapted to be attached to the board. A first lever, pivotally connected to the support block, is movable between first and second positions, and adapted to engage with the housing when in the first position and disengage from the housing when in the second position. A second lever is pivotally mounted on the first lever and adapted to hold the first lever in the first position by engagement with the support block. A spring is also provided for biasing the first lever towards the second position and also for biasing the second lever toward the position in which it engages with the support block.

12 Claims, 5 Drawing Sheets

LEVER MECHANISM

BACKGROUND OF THE INVENTION

This invention relates to lever mechanisms and, more specifically a lever mechanism for clamping printed electronic circuit boards into multi-pin sockets.

Electronic device manufacturers often, for the purposes of flexibility of design and ease of manufacture, produce devices comprising several separate circuit boards that are connected to each other and to the housing of the device via large multi-pin plug systems at their rear end. Connecting these boards to the main device housing and into the plugs can require considerable force, especially if a reliable contact is to be assured. Levers for circuit boards are commonly used by manufacturers, but do not retain the boards firmly in position, and can be jolted open, allowing the boards to work loose.

For example, German utility model No. 7724549 issued on Jan. 19, 1978 to Robert Bosch GmbH discloses a lever-type latch for a circuit board that, on closing, urges a board into contact with a connector, but is only latched in position by being retained on a pin attached to the board.

U.S. Pat. No. 4,157,583, issued on Jun. 5, 1979 and assigned to the General Electric Company, employs a cam mechanism to urge a circuit board into connection, and a shaft acting as a beam spring to provide a biasing force. Again, this device does not provide any secure latching mechanism.

German patent number 3732892, issued on Apr. 20, 1989 to Festo KG, discloses a latching mechanism that is secured with a screw-type mechanism.

United Kingdom patent application No. 22310726 discloses a circuit board latching mechanism with a retaining hook.

The object of the present invention is to provide a lever mechanism for clamping and retaining a circuit board in its housing.

SUMMARY OF THE INVENTION

According to the present invention there is provided a lever mechanism for clamping a board to a housing, said lever mechanism comprising:
  a support block adapted to be attached to a board;
  a first lever pivotally connected to said support block and movable between first and second positions, said first lever being adapted to engage with said housing when in said first position and disengage from said housing when in said second position;
  a second lever pivotally mounted on said first lever and adapted, in one position, to hold said first lever in said first position by engagement with said support block; and,
  a spring for biasing said first lever towards said second position and also for biasing said second lever toward said one position, in which it engages with said support block.

The support block may be arranged to hold a stud fastener that provides an additional latch for the board to the housing or frame in cases where the added security of tool operation is required. The spring may be arranged to include a sprag which would be used to retain the support block to the board.

The spring may be made of electrically conductive material and may be shaped so that it provides an electrical connection between the board and the housing.

Preferably, the first lever comprises two interconnecting longitudinal halves, each half having lugs and/or recesses on their inner surfaces to provide pivotable mountings for the first lever to the support block, and for the second lever on the first lever.

The lever mechanism of the present invention provides a clamping device that is easily engaged and disengaged, and that is also easily manufactured from a minimum number of components.

BRIEF DESCRIPTION OF THE DRAWINGS

One example of the present invention will now be described with reference to the accompanying drawings, in which.

DETAILED DESCRIPTION OF THE INVENTION

Figure 1:
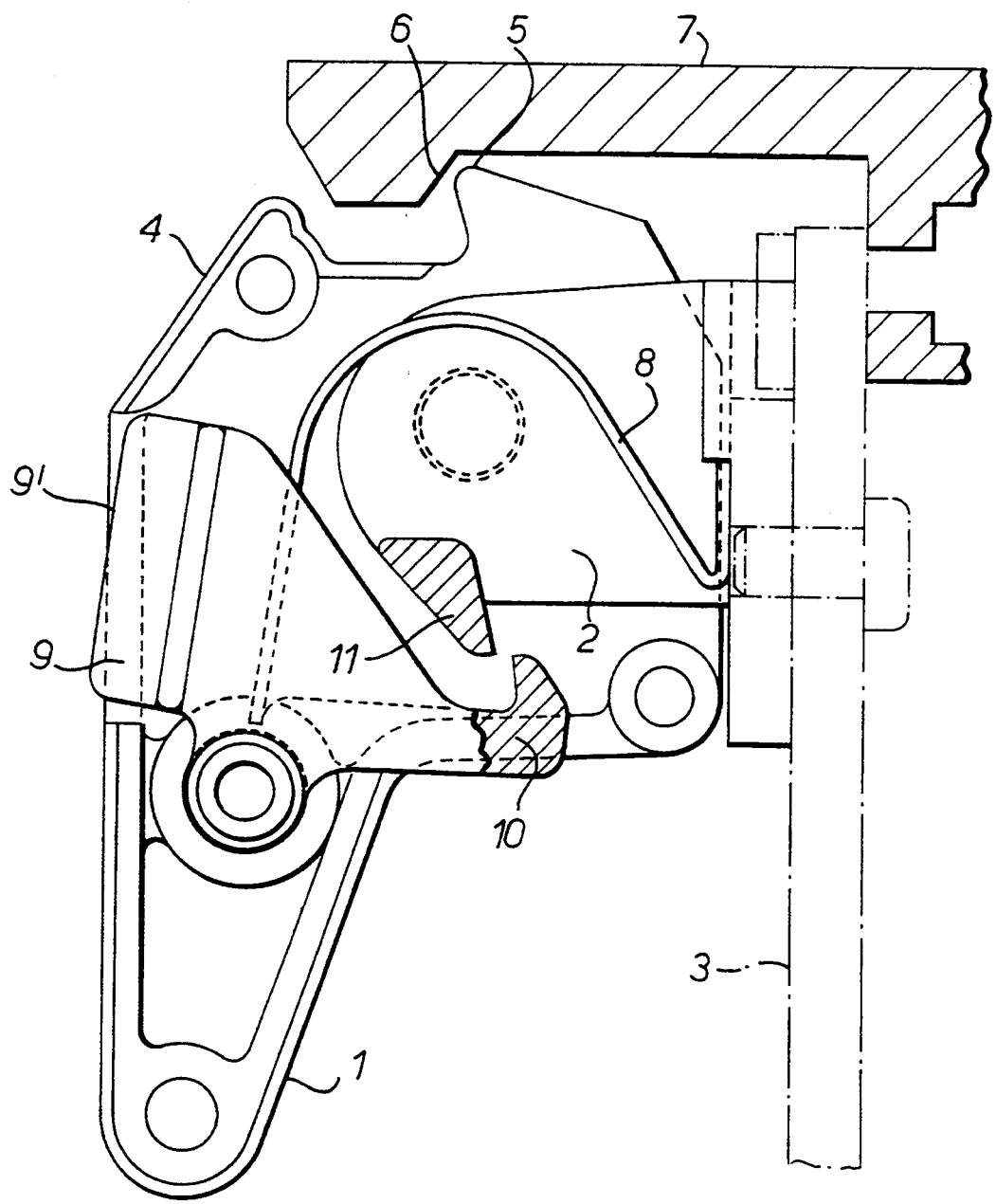
FIG. 1 shows the lever mechanism in its clamping position.
Figure 2:
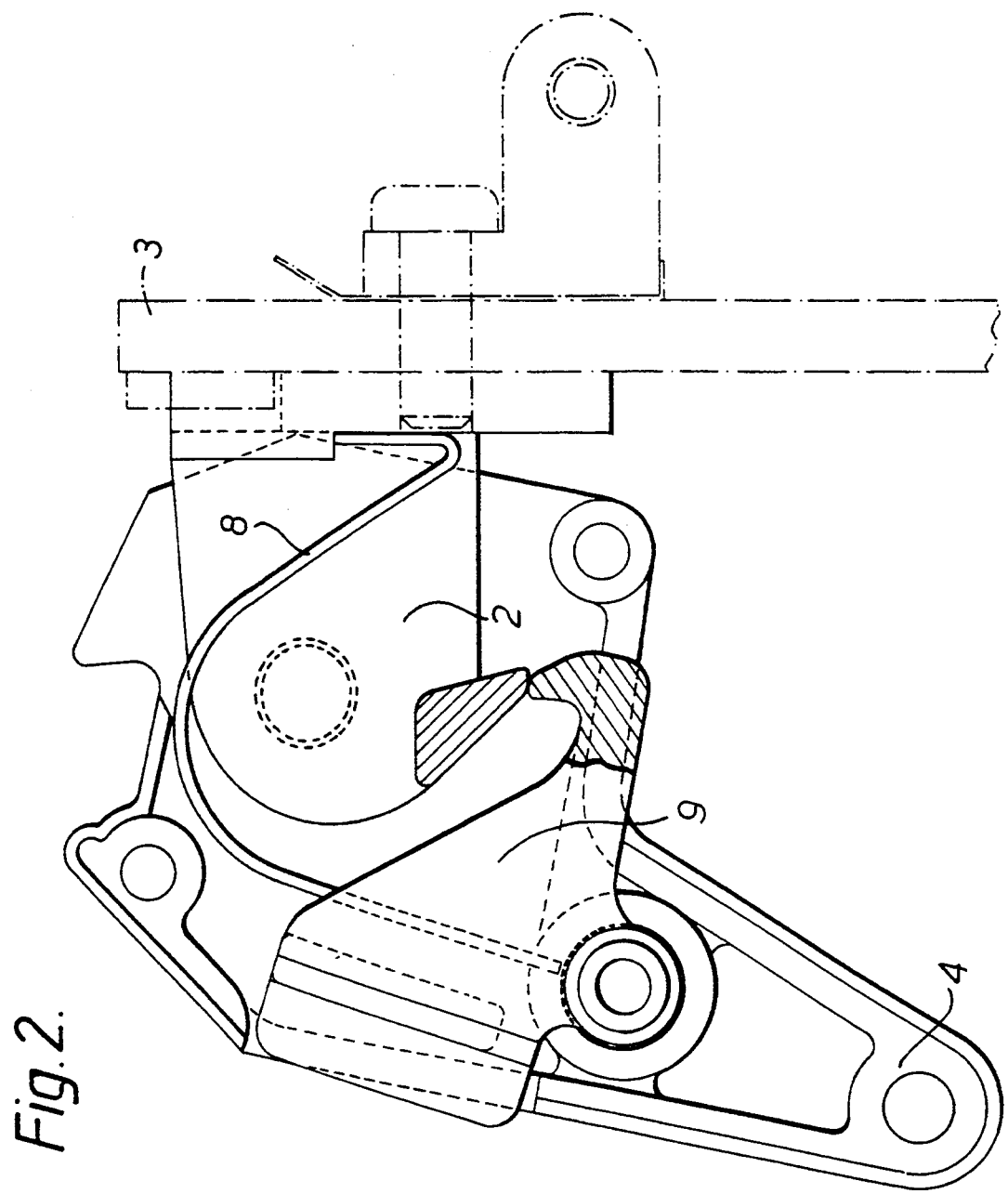
FIG. 2 shows the lever mechanism in a partially unclamped position.
Figure 3:
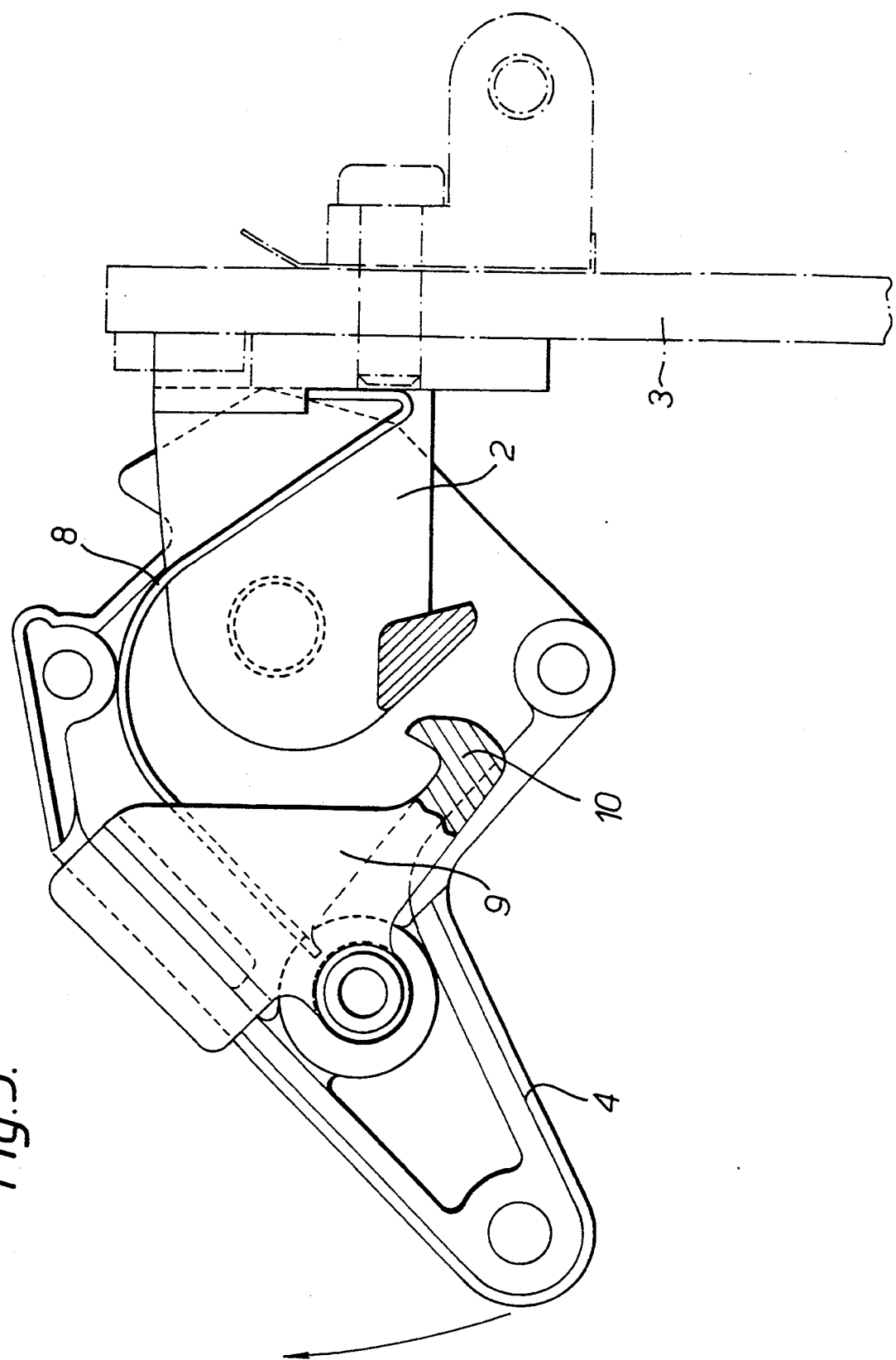
FIG. 3 shows the lever mechanism in its completely unclamped position.
Figure 4:
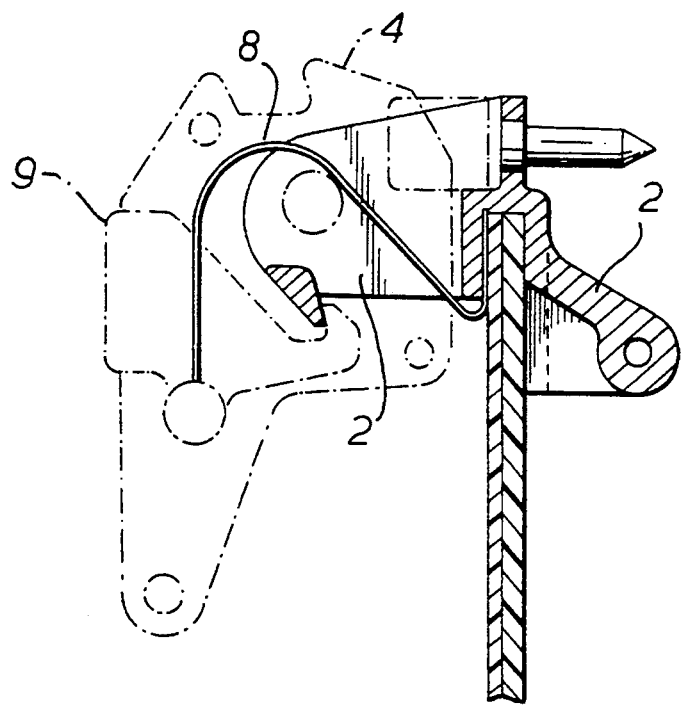
FIG. 4 shows the lever mechanism with a stud fastener integral with the support block.
Figure 5A:
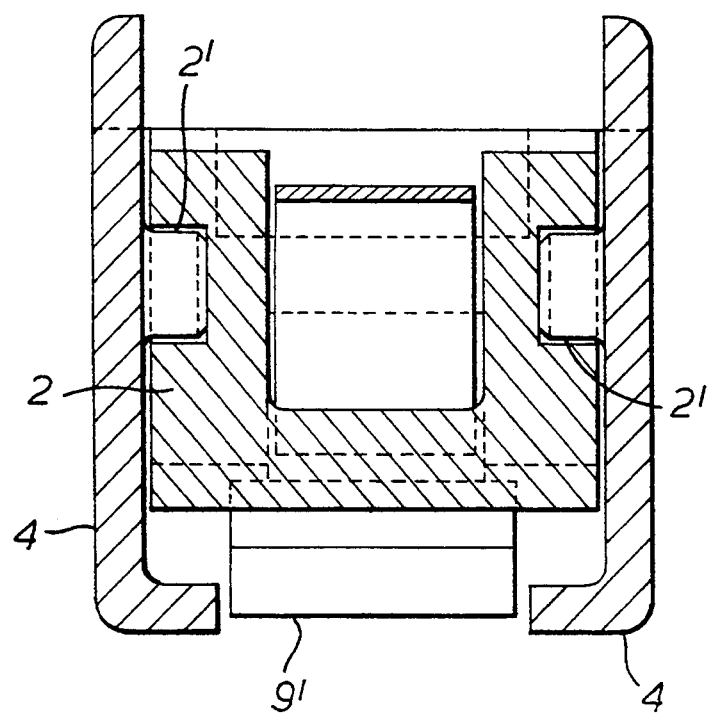
FIGS. 5A and 5B show views of the first lever.
Figure 5B:
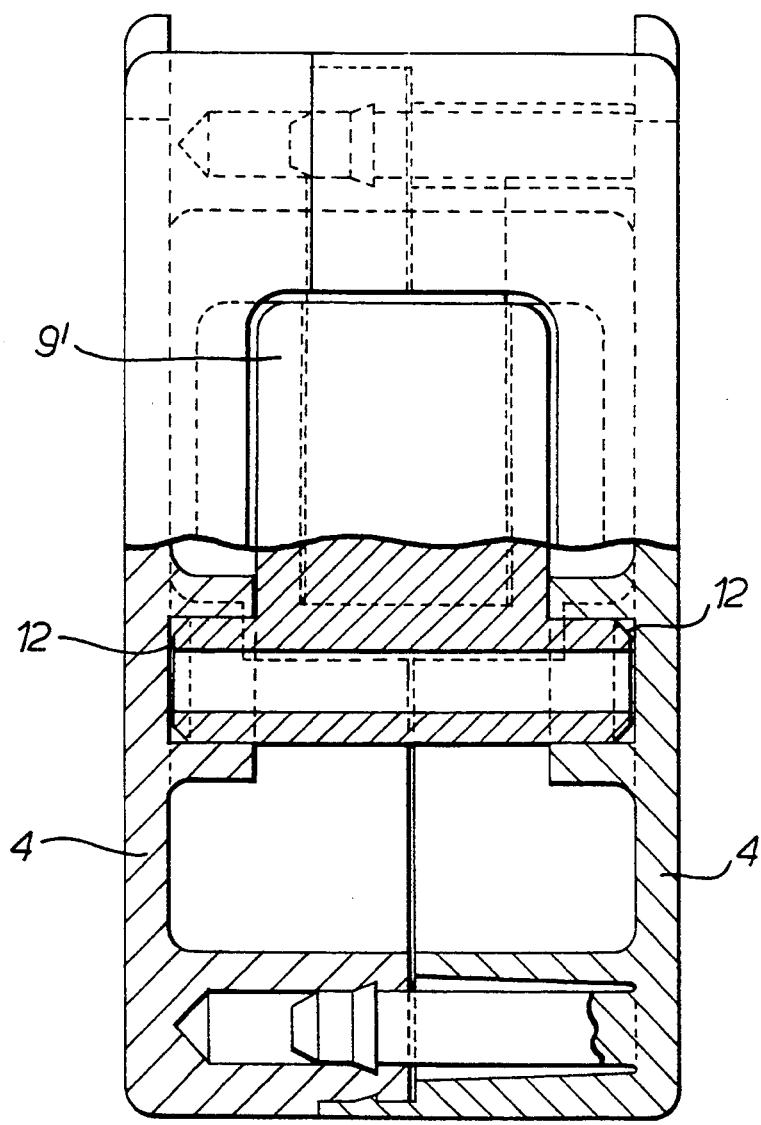

Referring to FIG. 1, the lever assembly 1 is attached, via a support block 2 to a board 3. The support block 2 can be attached to the board 3 by screws, a snap-fit assembly, or the like. Pivotally mounted in recesses 2' on the support block 2 is a first lever 4. The lever 4 comprises two sections (see FIG. 5A) which fit over the support block 2 and a second lever 9. The lever 4 has, on one edge, a lug 5 which, when in a locked position, engages with a lip 6 protruding from the inner edge of a housing 7 to clamp the board in position as shown. Connected to the support block 2 is a spring 8 which sits within the lever 4 and urges it into an unclamped position (shown in FIG. 3), in which the lug 5 is disengaged from the lip 6. As can be seen from FIG. 4, when the support block 2 is in position on the board 3, the spring 8 acts against the surface of the board 3 to resist removal of the block 2 from the board 3.

The second lever 9 is pivotally mounted in recesses 12 on the first lever 4. One end of the lever 9 is formed into a flat surface 9' so that it can be easily depressed. When this end of the lever 9 is depressed, the opposite end of the lever 9 pivots. This end of the second lever 9 is shaped to provide a hook 10 so as to be engageable with a lip 11 positioned on the support block 2 and in FIG. 1 is shown in a position disengaged from the lip 11. When the lever 4 is pushed into its clamping position, the spring 8 exerts a force on the second lever 9, which pivots to engage the hook 10 with the lip 11 thus holding the whole mechanism in a clamping position because the second lever is pivoted on the first lever and thus holds it. To release the lever mechanism 1, the second lever 9 is depressed, this disengages the hook 10 of second lever 9 from the lip 11 (as shown in FIG. 1) and the spring 8 then urges the lever 4 into the unclamped position.

When a board is to be connected to the housing and to an electrical socket, the board is placed gently in position and pressure applied to the lever 4, engaging the lug 5 against the lip 6 and thus applying an insertion force to the board. When the second lever 9 passes over the lip 11, the spring 8 forces the lever 9 into engagement with the lip 11 and the lever is locked.

To release the mechanism, the lever 9 is depressed, disengaging the lever 9 from the lip 11, and allowing the force of the spring 8 to move the lever 4 outward to the unclamped position. The board can then be removed.

I claim:

1. A lever mechanism for clamping a board to a housing, said lever mechanism comprising:
   a support block adapted to be attached to a board;
   a first lever pivotally connected to said support block and movable between first and second positions, said first lever being adapted to engage with said housing when in said first position and disengage from said housing when in said second position;
   a second lever pivotally mounted on said first lever and adapted, in one position, to hold said first lever in said first position by engagement with said support block; and,
   a spring for biasing said first lever towards said second position and also for biasing said second lever toward said one position, in which it engages with said support block.

2. A mechanism according to claim 1, wherein said support block is adapted to hold a stud fastener.

3. A mechanism according to claim 1, wherein said spring acts to retain said support block on a board.

4. A mechanism according to claim 1, wherein said spring is made of electrically conductive material and provides an electrical connection between said board and said housing.

5. A mechanism according to claim 1, wherein said first lever comprises two interconnecting longitudinal halves, each of said halves having lugs on its inner surface, said lugs providing pivotable mountings for said first lever on said support block, and for said second lever on said first lever.

6. A mechanism according to claim 1, wherein said first lever comprises two interconnecting longitudinal halves, each of said halves having recesses on its inner surface, said recesses providing pivotable mountings for said first lever on said support block, and for said second lever on said first lever.

7. A board and board housing assembly comprising:
   a board;
   a housing;
   a lever mechanism, said lever mechanism comprising:
   a support block attached to said board;
   a first lever pivotally connected to said support block and movable between first and second positions, said first lever being adapted to engage with said housing when in said first position and disengage from said housing when in said second position;
   a second lever pivotally mounted on said first lever and adapted, in one position, to hold said first lever in said first position by engagement with said support block; and,
   a spring for biasing said first lever towards said second position and also for biasing said second lever toward said one position, in which it engages with said support block.

8. An assembly according to claim 7, wherein said support block is adapted to hold a stud fastener.

9. An assembly according to claim 7, wherein said spring acts to retain said support block on said board.

10. An assembly according to claim 7, wherein said spring is made of electrically conductive material and provides an electrical connection between said board and said housing.

11. An assembly according to claim 7, wherein said first lever comprises two interconnecting longitudinal halves, each of said halves having lugs on its inner surface, said lugs providing pivotal mountings for said first lever on said support block, and for said second lever on said first lever.

12. An assembly according to claim 7, wherein said first lever comprises two interconnecting longitudinal halves, each of said halves having recesses on its inner surface, said recesses providing pivotable mountings for said first lever on said support block, and for said second lever on said first lever.

* * * * *